US008800879B2

(12) United States Patent
Fischer

(10) Patent No.: US 8,800,879 B2
(45) Date of Patent: Aug. 12, 2014

(54) INPUT/OUTPUT MODULE AND METHOD FOR OPERATING THE INPUT/OUTPUT MODULE

(75) Inventor: Peter Fischer, Schwandorf (DE)

(73) Assignee: Siemens Aktiengesellschaft, Munich (DE)

( * ) Notice: Subject to any disclaimer, the term of this patent is extended or adjusted under 35 U.S.C. 154(b) by 139 days.

(21) Appl. No.: 13/548,713

(22) Filed: Jul. 13, 2012

(65) Prior Publication Data

US 2013/0175336 A1 Jul. 11, 2013

(30) Foreign Application Priority Data

Jul. 21, 2011 (EP) .................................... 11174858

(51) Int. Cl.
*G06K 19/06* (2006.01)

(52) U.S. Cl.
USPC .......................................................... 235/492

(58) Field of Classification Search
CPC ........... H01R 2103/00; H01R 2107/00; H01R 24/62; H01R 43/26

USPC .......................................................... 235/492
See application file for complete search history.

(56) References Cited

U.S. PATENT DOCUMENTS

2013/0243106 A1* 9/2013 Toba et al. .................... 375/257

FOREIGN PATENT DOCUMENTS

| DE | 44 37 316 | 4/1996 |
| DE | 195 14 768 | 10/1996 |
| EP | 2 421 346 | 2/2012 |

* cited by examiner

*Primary Examiner* — Jamara Franklin
(74) *Attorney, Agent, or Firm* — Cozen O'Connor

(57) ABSTRACT

An input/output module of control technology configured to accommodate a front connector and read in process values comprising a field bus connection, wherein a first read/write unit configured to wirelessly transmit an individual character string into a second read/write unit is arranged in the front connector such that a unique assignment is established between the input/output module and the front connector in accordance with a connection standard.

9 Claims, 2 Drawing Sheets

INPUT/OUTPUT MODULE AND METHOD FOR OPERATING THE INPUT/OUTPUT MODULE

BACKGROUND OF THE INVENTION

1. Field of the Invention

The invention relates to a method for operating a control technology input/output module with a front connector, where signal lines are attached across a plurality of connecting elements arranged on a front side of the front connector corresponding to the function of the input/output module in accordance with a connection standard.

The invention also relates to a control technology input/output module, which is configured to accommodate a front connector and to read in process values, with a field bus connection.

Within the context of the invention, control technology is understood to mean the automation and control of industrial systems by memory-programmable controllers. In this case, the input/output modules are signal modules of a memory-programmable controller for instance, where the signal module forms an interface to the industrial process to be automated. The input/output modules, which are configured as signal modules, can be distinguished in terms of digital and analog modules. These in turn differ by their number of channels, input or output, measuring mode and measuring range, electrical isolation, diagnostic and alarm capabilities. Actuators/sensors from the process to be automated are connected through the front connector. The input/output module and front connector operate according to the pin-socket principle.

2. Description of the Related Art

When replacing an input/output module, the front connector can be detached from the modules to be replaced and in this way connection of the signal lines to the front connector remains. Such a replacement of a module is necessary, for example, if an old module is faulty and has to be replaced with a new functional module. With a module replacement, it may however result that the front connectors are mixed up or a module to be replaced, which does not correspond with the connection standard prevailing above, is inadvertently used. If the front connectors are mixed up in the case of a module replacement, this may result in a misinterpretation of the process data. To prevent this, a mix up of the front connector is to be ruled out.

DE 195 147 68 A1 proposes a solution of ruling out a mix-up of the front connectors. Here, the front connector contains a mechanical coding element that can be inserted into a counter element of the matching input/output module. Whenever the coding element and the counter element match, the front connector can be inserted into the input/output module.

SUMMARY OF THE INVENTION

It is an object of the invention to simplify the encoding of an input/output module for an associated front connector.

This and other objects and advantages are achieved in accordance with the invention by a method for operating a control technology input/output module with a front connector, where signal lines are attached across a plurality of connecting elements arranged on a front side of the front connector corresponding to the function of the input/output module in accordance with a connection standard, such that when the front connector is initially inserted into the input/output module, an individual character string is wirelessly transmitted into a second read/write unit arranged in the front connector by a first read/write unit arranged in the input/output module. As a result, a unique assignment is established between the input/output module and the front connector in accordance with the connection standard. Here, the wireless data transmission can be implemented, for instance, by a near field radio link, i.e., by a radio frequency identification (RFID) radio link. A mechanical coding element can therefore advantageously be omitted. This omission facilitates the construction and manufacture of such an input/output module.

In an embodiment of the method, the individual character string is stored in a configuration system for the input/output module and in a storage unit arranged in the front connector. Configuration system is understood, for instance, to be an automation technology engineering system. In this engineering system, the functionalities of input/output modules can be parameterized. Here, it is advantageous for a once parameterized input/output module to contain an individual character string in respect of its connection standard, where the character string is also stored in configuration data of the configuration system.

In order to further optimize the method in respect of a module replacement, the old input/output module is separated from the front connector in the instance of a replacement of the input/output module and is replaced by a new input/output module, where prior to insertion of the front connector into the new input/output module, this is connected to the configuration system and the configuration system writes the individual character string into a storage unit arranged in the new input/output module.

After insertion of the front connector into the new input/output module, a check is advantageously made by way of a testing device to determine whether the individual character string found in the new input/output module corresponds with the individual character string stored in the storage unit in the front connector. In the event that the two individual character strings match, the new input/output module activates a separation device, which validates the process values read in via the signal lines. On the other hand, the separation device invalidates the process values and a diagnostic message is sent.

The method can be applied with a control technology input/output module configured to accommodate a front connector and to read in process values, where the input/output module is provided with a field bus connection.

In accordingly, the object cited in the introduction which is also configured by a control technology input/output module in order to accommodate a front connector and to read in process values is achieved with a field bus connection in that a first read/write unit, which is configured to wirelessly transmit an individual character string into a second read/write unit arranged in the front connector. As a result, a unique assignment is established between the input/output module and the front connector in accordance with a connection standard. The mechanical coding elements and the counter element in the input/output modules can advantageously be omitted in the conventional input/output modules by the first read/write unit and the second read/write unit. Omission of additional mechanical elements renders operation of an input/output module and manufacture easier.

In a further embodiment, an input/output module is configured with a detection device, which is connected to the first read/write unit and upon initial insertion of the front connector into the input/output module, activates the first read/write unit to transmit the individual character string.

In a further embodiment, the field bus connection of the input/output module is configured such that in the event of a replacement of the input/output module, where the old input/output module is separated from the front connector and is replaced by a new input/output module. Here, the new input/output module can be connected to a configuration system by the field bus connection of the new input/output module, where the individual character string of the old input/output module, which is stored in the configuration system, is forwarded into the storage unit of the new input/output module by the field bus connection. The new input/output module now possesses the individual character string according to the connection rule for the front connector assigned thereto. In this case, an advantageous communication between the input/output module and front connector occurs wirelessly, preferably by an RFID connection. No additional plug contacts are required for coding on account of this wireless communication. Almost any number of codings can also be selected by an individual character string on account of the electronic coding.

It is also conceivable to prevent the insertion of front connectors from other manufacturers, for instance from counterfeit products, by using a manufacturer ID (manufacturer identification feature) because the front connector does not bear the matching manufacturer code and is therefore not accepted by the input/output module.

In a still further embodiment, the input/output module is provided with a filter arranged between the field bus connection and the storage unit, here the filter is configured to filter the individual character string of a prevailing telegram traffic out of the field bus. An automation technology field bus may be, for example, a profibus or a profinet.

Moreover, the input/output module includes a testing device and a separation device, where the testing device is configured to check whether the individual character string stored in the input/output module matches the individual character string stored in the front connector. The separation device is configured to validate the individual character strings when matching the individual character strings and, on the other hand, to invalidate the process values and to send a diagnostic message.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is described in more detail in the drawings, in which.

DETAILED DESCRIPTION OF THE PREFERRED EMBODIMENTS

Figure 1:
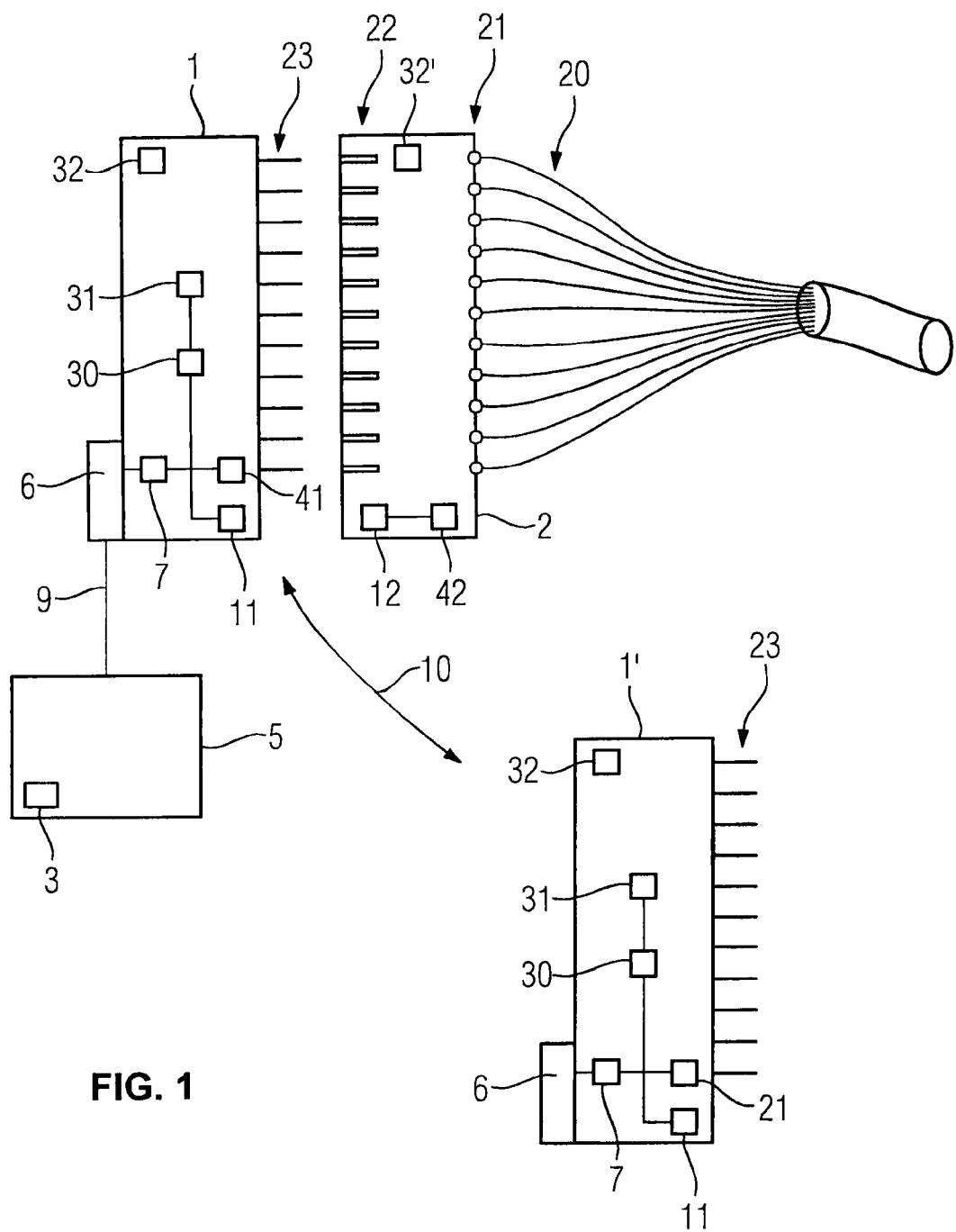
FIG. 1 is a schematic block diagram of an input/output module replaced by another input/output module.

With specific reference to FIG. 1, shown therein is an input/output module 1 that is configured to accommodate a front connector 2. To accommodate the front connector 2, the input/output module 1 comprises a male multipoint connector 23 with contact pins. Within the front connector 2, a socket assembly 22 with corresponding contact sockets forms the counter element relative to the male multipoint connector 23. In order to connect signal lines 20 to the front connector 2, the front connector 2 comprises connection elements 21. In order to forward process values read in over the signal lines 20 to a superordinate automation system or to a configuration system 5, the input/output module 1 comprises a field bus connection 6.

The signal lines according to a connection standard are attached to the front connector 2 by connection elements 21, each clamping point of the front connector 2 is guided by the corresponding socket contact of the socket assembly 22 to the corresponding blade contact of the male multipoint connector 23, and the input/output module 1 is parameterized thereupon such that a special signal is to be received on each blade contact. As a result, the input/output module 1 and the front connector 2 have to be matched to one another. This means that it is not possible for any module to be connected to any pin, which would possibly result in misinterpretations of the signals.

In order to prevent inadvertent insertion of an "incorrect" plug or an "incorrect" input/output module 1, the input/output model 1 comprises a first read/write unit 11, which is configured to wirelessly transmit an individual character string into a second read/write unit 12 arranged in the front connector 2. As a result, a unique assignment is established between the input/output module 1 and the front connector 2 in accordance with the necessary connection standard.

In order to implement initial identification of the front connector 20, the input/output module 1 is provided with a detection device 7 that is connected to the first read/write unit 1 such that upon initial insertion of the front connector 2 into the input/output module 1, the detection device 7 registers this insertion and the first read/write unit 11 triggers the individual character string to transmit into the second read/write unit 12 of the front connector 2. If this transmission of the individual character string occurred successfully, then the transmitted, individual character string is stored in a second storage unit 42 arranged in the front connector 2. The individual character string is also stored in a first storage unit 41 arranged in the input/output module 1.

In a configuration system 5, which is connected to a field bus connection 6 on the input/output module 1 by a field bus 9, the individual character string is stored in a storage area 3 in the configuration system 5.

If replacement of a module in the input/output module 1 is to occurs because it is faulty, for instance, then the faulty, old input/output module 1 can be replaced by a new, fully functioning input/output module 1'. Replacement of these two modules is indicated by the double arrow line replacement 10.

During a replacement 10, the front connector 2 is pulled from the old input/output module 1. The field bus connection 6 is also released from the old input/output module 1. The signal lines 20 may advantageously be left connected to the front connector 2.

The new, functional input/output module 1' now substitutes the old, faulty input/output module 1'. In this way, the field bus 9 is initially connected to the field bus connection 6 of the new input/output module 1'. The field bus 9 is connected to the configuration system 5. Consequently, an individual character string that applies to the old module can be obtained from the data memory of the configuration system 5 and transmitted into the new input/output module 1'. The individual character string is stored in the first storage unit 41 of the new input/output module 1'. It should be noted that the old input/output module 1 and the new input/output module 1' are structured identically, and the same reference characters thus have the same functionalities.

If the new input/output module 1' is operated, then the front connector 2 is initially pushed onto the new input/output module 1'. In order to check whether the new input/output module 1' fits with the front connector 2, the new input/output module 1' has a testing device 30 and a separation device 31, where the testing device 30 is configured to check whether the individual character string stored in the input/output module 1' matches the individual character string stored in the front connector 2, where the separation device 31 is configured to validate the process values if the individual character strings match and, on the other hand, to invalidate the process values and to send a diagnostic message.

Moreover, the input/output module 1' or also the input/output module 1 may comprise a manufacturer code 32. This manufacturer code 32 is used to read out and compare a corresponding opposite identifier 32', which is arranged in the front connector 2. If a front connector 2 without the corresponding opposite identifier 32' of the manufacturer is to be inserted, the testing device 30 is also configured to register this and to block the input/output module 1 or 1', because a connector which is different from that of the manufacturer is to be connected to the module.

Figure 2:
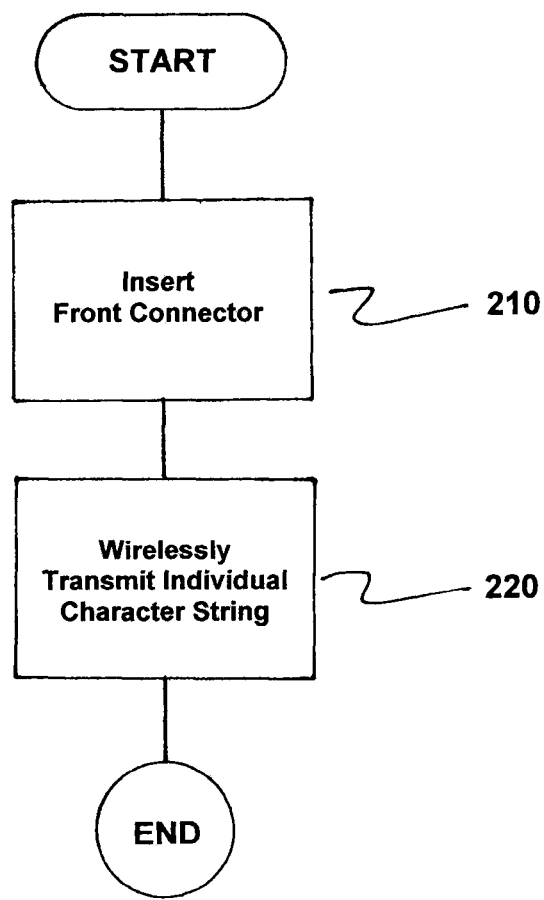
FIG. 2 is a flowchart of the method in accordance with an embodiment of the invention.

FIG. 2 is a flowchart of a method for operating an input/output module of a control technology with a front connector, where signal lines are attached by a plurality of connection elements arranged on a front side of the front connector in accordance with a function of the input/output module according to a connection standard. The method comprises initially inserting the front connector into the input/output module, as indicated in step 210. An individual character string is then wirelessly transmitted by a first read/write unit arranged in the input/output module into a second read/write unit arranged in the front connector after initially inserting the front connector into the input/output module such that a unique assignment is established between the input/output module and the front connector in accordance with the connection standard, as indicated in step 220.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for operating an input/output module of a control technology with a front connector, wherein signal lines are attached by a plurality of connection elements arranged on a front side of the front connector in accordance with a function of the input/output module according to a connection standard, the method comprising:
    initially inserting the front connector into the input/output module; and
    wirelessly transmitting, by a first read/write unit arranged in the input/output module, an individual character string into a second read/write unit arranged in the front connector after initially inserting the front connector into the input/output module such that a unique assignment is established between the input/output module and the front connector in accordance with the connection standard.

2. The method as claimed in claim 1, further comprising:
    storing the individual character string in a configuration system for the input/output module and in a storage unit arranged in the front connector.

3. The method as claimed in claim 2, further comprising:
    separating an old input/output module from the front connector when the old input/output module is to be replaced by a new input/output module; and
    connecting the new input/output module to the configuration system and writing, by the configuration system, the individual character string into a storage unit arranged in the new input/output module prior to insertion of the front connector into the new input/output module.

4. The method as claimed in claim 3, further comprising:
    checking, by a testing device to determine whether the individual character string in the new input/output module matches the individual character string stored in the memory unit in the front connector after insertion of the front connector into the new input/output module; and
    activating, by the new input/output module, a separation device in an event that the two individual character strings match to one of:
        validate process values read in over the signal lines; and
        invalidate the process values by the separation device and release a diagnostic message.

5. An input/output module of control technology configured to accommodate a front connector and read in process values, comprising:
    a field bus connection;
    a first read/write unit configured to wirelessly transmit an individual character string into a second read/write unit arranged in the front connector such that a unique assignment is established between the input/output module and the front connector in accordance with a connection standard; and
    a detection device connected to the first read/write unit and configured to activate the first read/write unit to transmit the individual character string upon initial insertion of the front connector into the input/output module.

6. The input/output module as claimed in claim 5, wherein the field bus connection is configured such that in an event of a replacement of the input/output module in which an old input/output module is separated from the front connector and is replaced by a new input/output module, the new input/output module is connectable to a configuration system by a field bus connection of the new input/output module, and wherein the individual character string of the old input/output module stored in the configuration system is routed into a storage unit of the new input/output module over the field bus connection.

7. The input/output module as claimed in claim 5, wherein the field bus connection is configured such that in an event of a replacement of the input/output module in which an old input/output module is separated from the front connector and is replaced by a new input/output module, the new input/output module is connectable to a configuration system by a field bus connection of the new input/output module, and wherein the individual character string of the old input/output module stored in the configuration system is routed into a storage unit of the new input/output module over the field bus connection.

8. The input/output module as claimed in claim 6, further comprising:
   a filter arranged between the field bus connection and the storage unit, the filter being configured to filter the individual character string out of a prevailing telegram traffic on the field bus.

9. An input/output module as claimed in claim 8, further comprising:
   a testing device configured to check whether the individual character string stored in the input/output module corresponds with the individual character string stored in the front connector; and
   a separation device configured to one of:
      validate the process values upon matching of the individual character strings; and
      invalidate the process values and send a diagnostic message.

* * * * *